(12) United States Patent
Hong et al.

(10) Patent No.: US 12,480,021 B2
(45) Date of Patent: Nov. 25, 2025

(54) COMPOSITION FOR SEMICONDUCTOR PROCESS, METHOD FOR PREPARING THE SAME AND METHOD FOR PREPARING SEMICONDUCTOR DEVICE USING THE SAME

(71) Applicant: SK enpulse Co., Ltd., Gyeonggi-do (KR)

(72) Inventors: Seung Chul Hong, Seoul (KR); Deok Su Han, Seoul (KR); Han Teo Park, Seoul (KR); Hwan Chul Kim, Gyeonggi-do (KR); Kyu Hun Kim, Gyeonggi-do (KR); Eun Sun Joeng, Gyeonggi-do (KR)

(73) Assignee: SK enpulse Co., Ltd., Gyeonggi-do (KR)

( * ) Notice: Subject to any disclaimer, the term of this patent is extended or adjusted under 35 U.S.C. 154(b) by 317 days.

(21) Appl. No.: 18/099,031

(22) Filed: Jan. 19, 2023

(65) Prior Publication Data
US 2023/0227696 A1    Jul. 20, 2023

(30) Foreign Application Priority Data
Jan. 20, 2022   (KR) .................. 10-2022-0008308

(51) Int. Cl.
*C09G 1/02* (2006.01)
*C09K 3/14* (2006.01)
(Continued)

(52) U.S. Cl.
CPC .............. *C09G 1/02* (2013.01); *C09K 3/1436* (2013.01); *H01L 21/3212* (2013.01); *H01L 21/7684* (2013.01); *H01L 23/53266* (2013.01)

(58) Field of Classification Search
None
See application file for complete search history.

(56) References Cited

U.S. PATENT DOCUMENTS

2005/0208883 A1    9/2005   Yoshida et al.
2008/0287038 A1    11/2008  Miyabe et al.
(Continued)

FOREIGN PATENT DOCUMENTS

CN    101351518 A    1/2009
CN    109957335 A    7/2019
(Continued)

OTHER PUBLICATIONS

Office Action for the Korean Patent Application No. 10-2022-0008308 issued by the Korean Intellectual Property Office on Mar. 19, 2024.
(Continued)

*Primary Examiner* — Stephanie P Duclair
(74) *Attorney, Agent, or Firm* — IP & T GROUP LLP

(57) ABSTRACT

The present disclosure is a composition for a semiconductor process applied to a polishing process of a semiconductor wafer and, more specifically, to a semiconductor process involving a polishing process of a semiconductor wafer, wherein the composition includes abrasive particles, and the zeta potential of the abrasive particles is −50 mV to −10 mV at a pH of 6, and the zeta potential change rate represented by Equation 1 below is 6 mV to 30 mV: [Equation 1] Zeta potential change rate (mV/pH)=|(Z6−Z5)/(p6−p5)| where p6 denotes pH 6, p5 denotes pH 5, Z6 denotes a zeta potential at the pH 6, and Z5 denotes a zeta potential at the pH 5.

13 Claims, 5 Drawing Sheets

(51) Int. Cl.
  *H01L 21/321* (2006.01)
  *H01L 21/768* (2006.01)
  *H01L 23/532* (2006.01)

(56) References Cited

U.S. PATENT DOCUMENTS

| | | | |
|---|---|---|---|
| 2012/0171936 A1* | 7/2012 | Haerle | C01G 25/02 51/308 |
| 2019/0153279 A1* | 5/2019 | Tawarazako | H01L 21/304 |
| 2021/0017422 A1* | 1/2021 | Iwano | C09K 3/1463 |

FOREIGN PATENT DOCUMENTS

| | | | |
|---|---|---|---|
| JP | 2005162533 A * | 6/2005 | |
| JP | 2008288398 A | 11/2008 | |
| JP | 2008546214 A | 12/2008 | |
| KR | 10-2008-0016934 A | 2/2008 | |
| KR | 10-2016-0142995 A | 12/2016 | |
| TW | 201542785 A | 11/2015 | |
| WO | WO-2019181013 A1 * | 9/2019 | ........... B24B 1/00 |
| WO | 2021/107048 A1 | 6/2021 | |

OTHER PUBLICATIONS

Office Action for the Japanese Patent Application No. 2023-006751 issued by the Japanese Patent Office on Dec. 12, 2023.
The Singaporean Search Report for the Singaporean Patent Application No. 10202300122T completed by the Intellectual Property Office of Singapore on Jun. 24, 2024.
The Written Opinion for the Singaporean Patent Application No. 10202300122T completed by the Intellectual Property Office of Singapore on Jun. 25, 2024.
Office Action for Chinese Patent Application No. 202310072545.2 issued by the Chinese Patent Office on Oct. 21, 2024.
Office Action for the Taiwanese Patent Application No. 112102489 issued by the Taiwanese Patent Office on Jul. 31, 2023.

* cited by examiner

[FIG. 1]
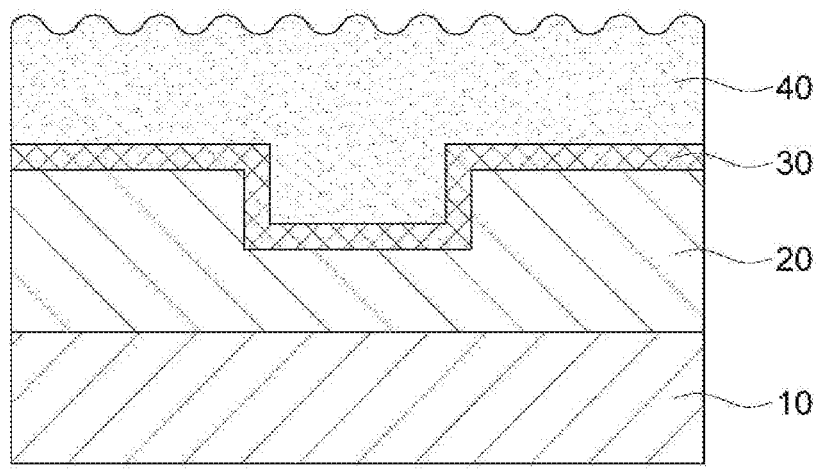

[FIG. 2]
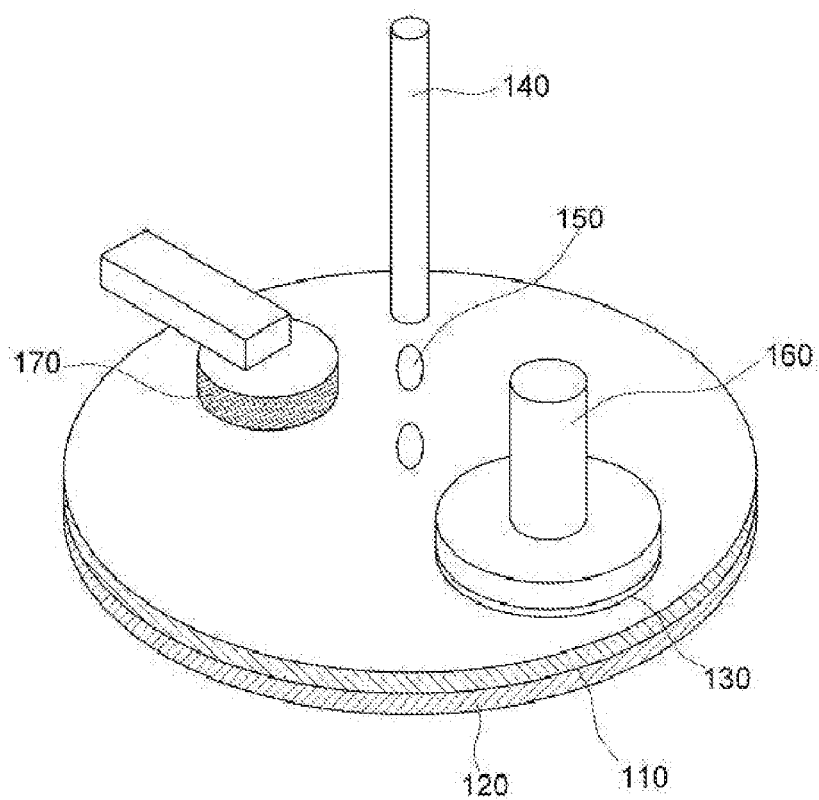

[FIG. 3]
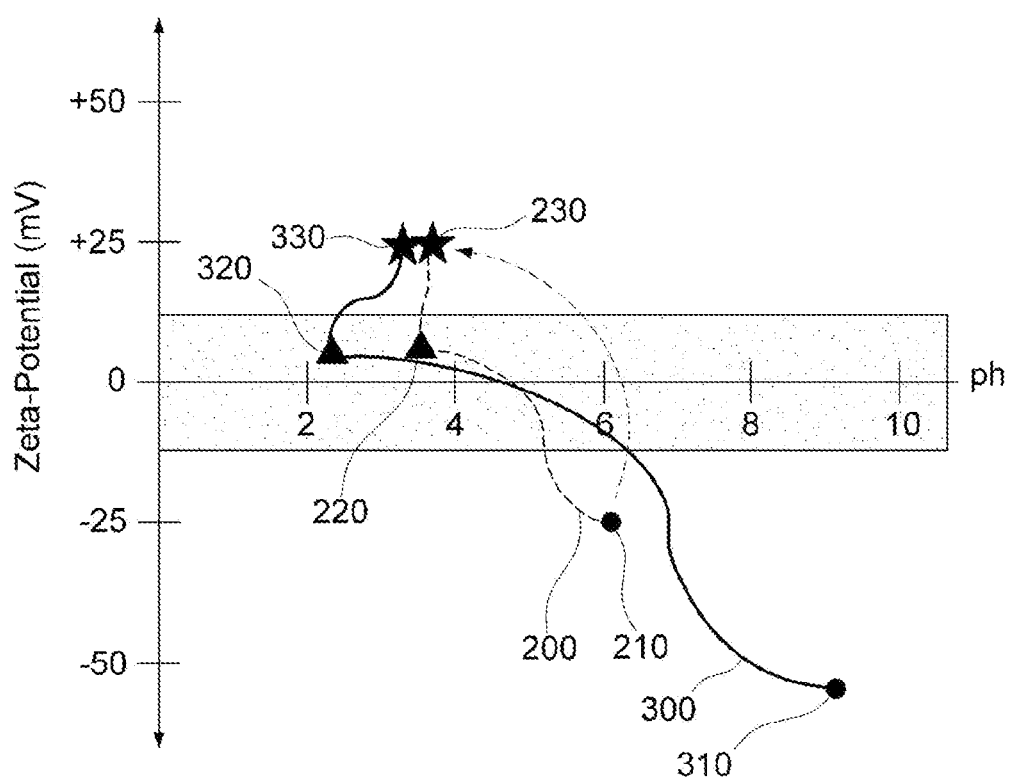

[FIG. 4]
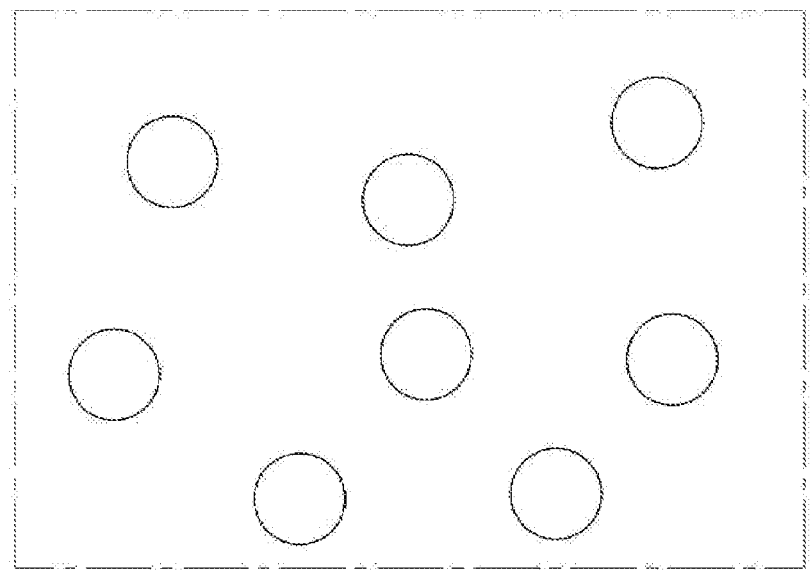
[FIG. 5]
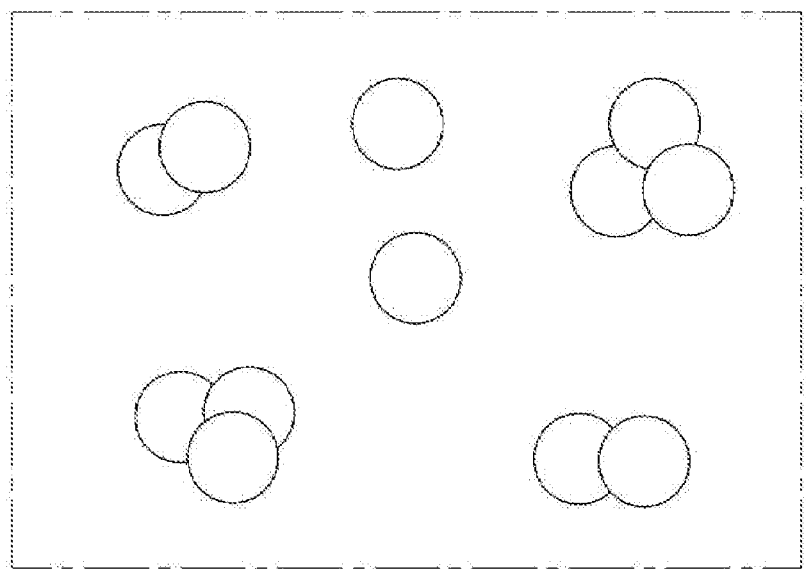

[FIG. 6]
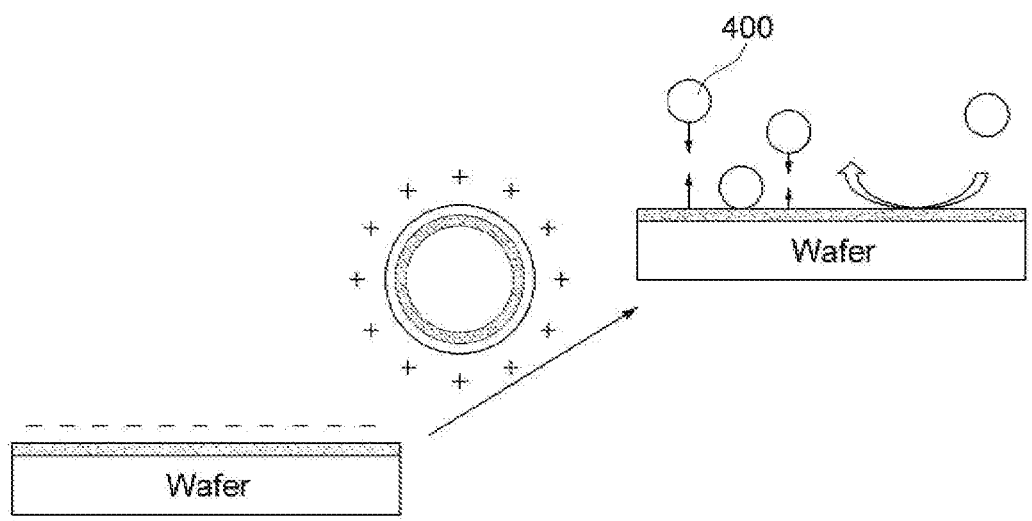
[FIG. 7]
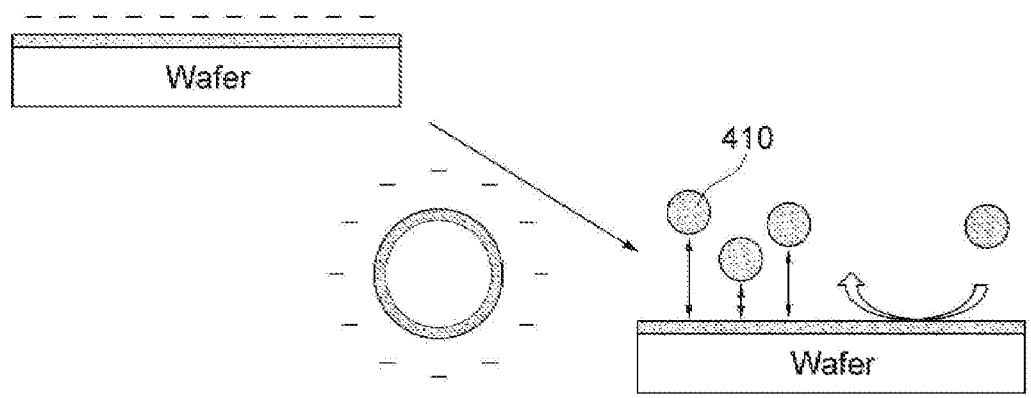

COMPOSITION FOR SEMICONDUCTOR PROCESS, METHOD FOR PREPARING THE SAME AND METHOD FOR PREPARING SEMICONDUCTOR DEVICE USING THE SAME

TECHNICAL FIELD

The present disclosure relates to a composition applicable to semiconductor manufacturing and processing and a method for preparing the same, and more particularly, to a composition applicable to a polishing process during semiconductor manufacturing and processing and a method for preparing the same.

BACKGROUND ART

Chemical mechanical polishing is a technique by which the surface of a sample is polished to a target level while injecting a polishing slurry into the interface between a polishing pad and a polishing target and while causing friction between the surfaces of the polishing pad and the polishing target.

As modern chemical mechanical polishing is applied to the manufacture of large-scale semiconductor integrated circuits, it is used as an essential technology for planarization of interlayer insulating film surfaces of multilayer wirings and elements such as transistors, formation of tungsten or copper wires, and the like.

As the degree of integration of semiconductor devices increases every year and the size of chips decreases, the surface structure of semiconductor devices becomes more complex and the level difference between layers becomes larger. Accordingly, high resolution lithography and atomic-level planarization technology are required for a chemical mechanical polishing (CMP) process applied to a preparing process of a semiconductor device.

This CMP process is a process of planarizing a film by simultaneously utilizing physical frictional force and chemical reaction, and significantly different polishing results may be yielded even by minute differences in process components and/or process solutions utilized therefor.

Accordingly, the precision required for preparing and designing these process parts and/or process solutions is rising to a higher level.

SUMMARY OF INVENTION

Technical Problem

An object of the present disclosure is to provide a composition for a semiconductor process, a method for preparing the same, and a method for preparing a semiconductor device using the same.

Another object of the present disclosure is to provide a composition for a semiconductor process which is applied to a semiconductor process involving a polishing process of a semiconductor wafer, so that it can realize excellent polishing performance, minimize faults such as defects, and realize a planarized polishing result.

Another object of the present disclosure is to provide a method for preparing a composition for a semiconductor process which has excellent dispersibility by minimizing the pH shock of abrasive particles and thus preventing aggregation among particles.

Another object of the present disclosure is to provide a method for preparing a semiconductor device which has a minimized defect rate by applying the composition for a semiconductor process to the polishing of a semiconductor wafer.

Solution to Problem

In order to achieve the above-described objects, a composition for a semiconductor process according to an embodiment of the present disclosure includes abrasive particles, wherein the abrasive particles may have a zeta potential of −50 mV to −10 mV at pH 6, and a zeta potential change rate represented by Equation 1 below of 6 mV/pH to 30 mV/pH:

$$\text{Zeta potential change rate(mV/pH)} = |(Z6-Z5)/(p6-p5)| \quad \text{[Equation 1]}$$

where p6 denotes pH 6, p5 denotes pH 5,
Z6 denotes a zeta potential at the pH 6, and Z5 denotes a zeta potential at the pH 5.

In an embodiment of the present disclosure, a method for preparing a composition for a semiconductor process may include adjusting pH to pH 2 to pH 4 by adding an acidic solution to abrasive particles having a pH of 6 and a zeta potential of −50 mV to −10 mV; and stirring the pH-adjusted abrasive particles and adding an organic component and an organic acid to the abrasive particles.

In an embodiment of the present disclosure, a method for preparing a semiconductor device includes preparing a surface plate on which a polishing pad having a polishing surface is mounted; preparing a carrier accommodating a polishing target; rotating the surface plate and the carrier in a state in which the polishing surface of the polishing pad and a polished surface of the polishing target are arranged to be in contact with each other; and supplying a composition for a semiconductor process onto the polishing surface, where the abrasive composition for a semiconductor process has a zeta potential change rate of 6 mV/pH to 30 mV/pH represented by Equation 1 below:

$$\text{Zeta potential change rate(mV/pH)} = |(Z6-Z5)/(p6-p5)| \quad \text{[Equation 1]}$$

where p6 denotes pH 6, p5 denotes pH 5,
Z6 denotes a zeta potential at the pH 6, and Z5 denotes a zeta potential at the pH 5.

Advantageous Effects

The present disclosure is applied to a semiconductor process involving a polishing process of a semiconductor wafer, so that it can realize excellent polishing performance, minimize faults such as defects, and realize a planarized polishing result.

Additionally, when a method for preparing a semiconductor device using an abrasive composition for a semiconductor process having excellent dispersibility by minimizing pH shock of abrasive particles and thus preventing aggregation among particles is applied, a semiconductor device with a minimized defect rate can be prepared.

BRIEF DESCRIPTION OF DRAWINGS

FIG. 1 schematically illustrates the configuration of a semiconductor device.

FIG. 2 schematically illustrates a configuration relating to a method for preparing a semiconductor device.

FIG. 3 relates to a change in zeta potential according to a change in pH of abrasive particles according to an embodiment of the present disclosure.

FIG. 4 shows a stabilization state of the abrasive particles.

FIG. 5 shows an unstable state of the abrasive particles.

FIG. 6 schematically shows a relationship between a zeta potential of the abrasive particles and a zeta potential of the semiconductor wafer.

FIG. 7 schematically shows a relationship between a zeta potential of the abrasive particles and a zeta potential of the semiconductor wafer.

DESCRIPTION OF EMBODIMENTS

Advantages and features of the present disclosure, and methods for achieving them will become apparent with reference to the embodiments to be discussed later. However, the present disclosure is not limited to the embodiments disclosed below, but will be implemented in a variety of different forms, and the present embodiments are only provided so that the description of the present disclosure is complete, and to fully inform those of ordinary skill in the art to which the present disclosure belongs, of the scope of the disclosure, and the disclosure is only defined by the scope of the claims.

In this specification, the term "comprise", "contain", or "include" means that other components may be further included unless otherwise specified.

In the drawings, the thickness is shown enlarged to clearly express the various layers and regions. And, in the drawings, the thicknesses of some layers and regions are exaggerated for convenience of description. Like reference numerals refer to like components throughout the specification.

Additionally, in this specification, when it is stated that a portion of a layer, film, region, plate, or the like is "on" or "on the top of" another portion, it includes not only the case where it is "directly on" another portion, but also the case where other portion is interposed therebetween. Conversely, when a portion is described as being "directly on" another portion, it means that there is no other portion therebetween. Additionally, when it is stated that a portion of a layer, film, region, plate, or the like is "under" or "under the bottom of" another portion, it is construed as including not only the case where it is "directly under" another portion, but also the case where other portion is interposed therebetween. Conversely, when a portion is described as being "directly under" another portion, it means that there is no other portion therebetween.

In the present disclosure, the abrasive particles are defined as inorganic particles dispersed in a solvent such as water, and the pH of the abrasive particles means the pH in a state of being dispersed in the solvent such as water.

A composition for a semiconductor process according to an embodiment of the present disclosure may include abrasive particles, wherein the abrasive particles may have a zeta potential of −50 mV to −10 mV at pH 6, and a zeta potential change rate represented by Equation 1 below of 6 mV/pH to 30 mV/pH:

Zeta potential change rate(mV/pH)=|(Z6−Z5)/(p6−p5)|     [Equation 1]

where p6 denotes pH 6, p5 denotes pH 5,

Z6 denotes a zeta potential at the pH 6, and Z5 denotes a zeta potential at the pH 5.

As the composition for a semiconductor process includes the abrasive particles having a zeta potential change rate represented by Equation 1, aggregation among abrasive particles in the composition can be prevented, and faults such as defects occurring in the polishing process can be prevented, and excellent polishing performance can be realized when being applied to a semiconductor process of polishing a tungsten film and a metal barrier film.

A semiconductor wafer to be subjected to a polishing process using the composition for a semiconductor process of the present disclosure is shown in FIG. 1. As shown in FIG. 1, a $SiO_2$ oxide film 20 may be formed as an interlayer insulating film on a silicon substrate 10, and a contact hole may be formed by etching the $SiO_2$ oxide film 20.

Subsequently, a metal barrier film 30 such as Ti/TiN (adhesive layer/diffusion barrier layer) may be formed on the front surface of the substrate including the contact hole, and a tungsten (W) film 40 may be deposited on the upper portion of the barrier film to completely fill the contact hole. Thereafter, the tungsten film 40 and the metal barrier film 30 on the $SiO_2$ oxide film 20 may be polished through a chemical mechanical polishing process using the composition for a semiconductor process, so that a tungsten plug may be formed.

During the manufacturing process of the semiconductor device as described above, the composition for a semiconductor process generally may include abrasive particles and other additives, wherein the abrasive particles may be for mechanical polishing of a target film, and other additives may be included to improve or supplement the performance of the composition for a semiconductor process.

In the composition for a semiconductor process, when the value of Equation 1 above satisfies the said range, the abrasive particles can exhibit a high level of dispersibility, enabling the provision of an abrasive composition in which the particle sizes are uniformly distributed.

Specifically, in the composition for a semiconductor process of the present disclosure, the abrasive particles may have a zeta potential of −50 mV to −10 mV at a pH of 6. By preparing the polishing composition using abrasive particles having the zeta potential of −50 mV to −10 mV at pH 6 as described above, the polishing composition can be prepared using weakly acidic abrasive particles, so the polishing composition having excellent dispersibility can be prepared without performing a separate aging process. That is, as described later, the abrasive particles may be surface-treated with an organic component. In order to surface-treat the abrasive particles as described above, the abrasive particles in a weakly acidic state may be mixed with an organic component while adjusting the pH of the abrasive particles to an acidic state. When the mixed organic component adheres to the surfaces of the abrasive particles, the abrasive particles may be surface-treated. During the surface treatment process, even if the pH of the abrasive particles in a weakly acidic state is changed to an acidic state, such pH change does not induce a pH shock, so aggregation among the particles does not occur.

Conventionally, abrasive particles included in a composition for a semiconductor process use abrasive particles dispersed in a strong alkali solution, and the pH of the abrasive particles in the strong alkali state can be changed to a strong acid state through a process of mixing and stirring with an acidic solution at the time of preparing the composition for a semiconductor process. During the process of mixing and stirring with the acidic solution, the abrasive particles undergo a pH shock due to a sudden change in pH, which may lead to the aggregation among the particles.

The acidic solution is specifically an organic acid, and, for example, the organic acid may include one selected from the group consisting of nitric acid, acetic acid, formic acid, benzoic acid, nicotinic acid, picolinic acid, alanine, phenylalanine valine, leucine, isoleucine, arginine, aspartic acid, citric acid, adipic acid, succinic acid, oxalic acid, glycine, glutamic acid, glutaric acid, phthalic acid, histidine, threonine, serine, cysteine, methionine, asparagine, tyrosine, diiodotyrosine, tryptophan, proline, oxyproline, ethylenediaminetetraacetic acid (EDTA), nitrotriacetic acid (NTA), iminodiacetic acid (IDA), and combinations thereof. In one embodiment, the organic acid may be nitric acid or acetic acid, but is not limited to the aforementioned examples, and any organic acid capable of maintaining a stable dispersion of abrasive particles in a solution and adjusting the pH to strong acidity may be used without limitation.

Specifically, FIG. 3 relates to a change in zeta potential according to a change in pH of abrasive particles according to an embodiment of the present disclosure. FIG. 4 shows a case where the abrasive particles are in a stable state, and FIG. 5 shows the aggregation among the abrasive particles in an unstable state.

FIG. 3 relates to the zeta potential change according to the pH of the abrasive particles, and the zeta potential values of the abrasive particles 200 and 300 may be changed from negative values to positive values 210, 220, 310, 320 by pH change, and the zeta potential value may be further changed 230, 330 by surface modification of the abrasive particles.

More specifically, looking at the zeta potential change of the abrasive particles 200 dispersed in the weakly acidic solution, the abrasive particles 210 dispersed in the initial weakly acidic solution may exhibit a negative zeta potential value, and the zeta potential of the abrasive particles 220 dispersed in a solution whose pH is changed to be strongly acidic by mixing with the acidic solution may change to a positive value.

Additionally, looking at the change in the zeta potential value of the abrasive particles 300 dispersed in the strongly alkaline solution, the abrasive particles 310 dispersed in the initial strongly alkaline solution may exhibit a negative zeta potential value, and when being prepared as an abrasive composition, the zeta potential of the abrasive particles 320 whose pH is changed to be strongly acidic by mixing with an acidic solution may change to a positive value.

At this time, when the abrasive particles 310 dispersed in the strongly alkaline solution are mixed with the acidic solution, the reaction time and stabilization of the abrasive particles may take a long time due to pH shock.

The stable state of the abrasive particles may refer to a state in which a repulsive force acts between the particles to maintain a certain distance therebetween, as shown in FIG. 4, and an unstable state between abrasive particles may refer to aggregation.

When the abrasive particles dispersed in the strongly alkaline solution are mixed with the acidic solution, a pH shock occurs due to a sudden pH change, which may cause aggregation as shown in FIG. 5. That is, an aging process for stabilization of the abrasive particles is required due to the pH shock generated in the abrasive particles, and for this reason, an additional process is required for the preparation of a composition for a semiconductor process, so the total process time may be increased.

In contrast, when using the abrasive particles 200 and 210 under a weakly acidic environment as in the present disclosure, the change in pH thereof is small even when being mixed with an acidic solution during the process of being prepared as a composition for a semiconductor process, so no pH shock occurs in the abrasive particles, and a stable state can be maintained between the abrasive particles. As shown in FIG. 4, when the polishing composition is prepared in a state in which the abrasive particles are maintained in a stable state, the separate aging process for the abrasive particles may be omitted.

When the abrasive particles of the present disclosure are prepared as a composition for a semiconductor process, a stable state is maintained between the abrasive particles, so they have a uniform size within a certain range. Specifically, as a result of LPC measurement using an accusizer Fx Nano (PSSA company) while injecting at 15 ml/min the composition for a semiconductor process which has been diluted such that an initial concentration is 4,000/ml, a minimum size is 0.56 μm, and a maximum size is 20 μm, the number of particles greater than 5 μm may be from about 100 to about 700, from about 100 to about 500, from about 100 to about 450, or from about 100 to about 400. The number of particles greater than 3 μm may be from about 100 to about 1,100, from about 200 to about 1,000, from about 300 to about 900, or from about 400 to about 900. The number of particles greater than 1 μm may be from about 1,000 to about 3,400, from about 1,200 to about 3,000, from about 1,300 to about 2,800, or from about 1,500 to about 2,500. As a result of the LPC measurement as described above, the composition for a semiconductor process of the present disclosure includes abrasive particles having a small diameter, so that when it is used in a polishing process, the occurrence of defects such as defects on the surface of a semiconductor wafer can be prevented.

As described above, the abrasive particles of the present disclosure have no effect on stabilization according to pH change, and are characterized in that the zeta potential change rate represented by Equation 1 below is from 6 mV/pH to 30 mV/pH:

$$\text{Zeta potential change rate(mV/pH)} = |(Z6-Z5)/(p6-p5)| \quad \text{[Equation 1]}$$

where p6 denotes pH 6, p5 denotes pH 5,
Z6 denotes a zeta potential at the pH 6, and Z5 denotes a zeta potential at the pH 5.

The zeta potential change rate according to Equation 1 may be from 6 mV/pH to 30 mV/pH, from 14 mV/pH to 24 mV/pH, from 14 mV/pH to 19 mV/pH, or from 14.5 mV/pH to 18.5 mV/pH. In the case of preparing an abrasive composition using the abrasive particles having the zeta potential change rate within the aforementioned ranges, when it is mixed with an acidic solution, the change in pH is small, so a pH shock does not occur in the abrasive particles, and thus a stable state can be maintained between the abrasive particles, so that the manufacturing efficiency of the polishing composition can be increased. Additionally, as the stable state is maintained between the abrasive particles, aggregation does not occur, and thus, when they are applied to a polishing process, the occurrence of defects can be prevented.

Said zeta potential change rate is the zeta potential change rate which has been checked when the pH was weakly acidic, and the zeta potential change rate may be from about 14 mV/pH to about 30 mV/pH, when the pH is changed from 6 to 5 as the abrasive particles for preparing the polishing composition in a state of being dispersed in the initial weakly acidic solution are mixed with the acidic solution.

Additionally, when the pH for the abrasive particles of the present disclosure is changed from 5 to 4, the zeta potential change rate may be from about 10 mV/pH to about 55 mV/pH, from about 15 mV/pH to about 48 mV/pH, or from about 16 mV/pH to about 44 mV/pH. When the pH for the abrasive particles of the present disclosure is changed from 4 to 3, the zeta potential change rate may be from about 0 mV/pH to about 10 mV/pH, from about 0.5 mV/pH to about 6 mV/pH, or from about 0.5 mV/pH to about 5 mV/pH. When the pH for the abrasive particles of the present disclosure is changed from 3 to 2, the zeta potential change rate may be from about −5 mV/pH to about 10 mV/pH, from about −3 mV/pH to about 8 mV/pH, or from about 1 mV/pH to about 7 mV/pH. When the pH for the abrasive particles of the present disclosure is changed from 2 to 1, the zeta potential change rate may be from about −5 mV/pH to about 10 mV/pH, from about −3 mV/pH to about 8 mV/pH, or from about −2 mV/pH to about 6 mV/pH. When the above-described zeta potential change rate is satisfied, the abrasive particles in the composition for a semiconductor process do not aggregate, and are included in a stable state, so that when being applied to a polishing process, the abrasive particles not only can provide excellent polishing performance, but also can prevent defects from occurring in the polishing process.

The abrasive particles of the present disclosure are characterized in that the zeta potential change rate represented by Equation 2 below is from 14 mV/pH to 40 mV/pH:

$$\text{Zeta potential change rate}=|(Z6-Z4)/(p6-p4)| \quad \text{[Equation 2]}$$

where p6 denotes pH 6, p4 denotes pH 4,
Z6 denotes a zeta potential at the pH 6, and Z4 denotes a zeta potential at the pH 4.

The zeta potential change rate according to Equation 2 may be from about 14 mV/pH to about 40 mV/pH, from about 20 mV/pH to 38 mV/pH, or from about 22 mV/pH to about 35 mV/pH. As described above, the abrasive particles of the present disclosure are provided in a weakly acidic state, and are prepared as the composition for a semiconductor process. Thus, when the pH of the abrasive particles is changed from the weakly acidic state by the supply of an organic acid, the zeta potential of the abrasive particles may also change. Referring to FIG. 3, the weakly acidic abrasive particles 210 have a pH of 6, and when being prepared as the composition for a semiconductor process, the pH thereof may be changed to 4 (220). Due to the pH change as described above, the zeta potential value of the abrasive particles changes, and the occurrence of pH shock is determined according to the degree of change in the zeta potential value, but as shown in FIG. 3, when the range of Equation 2 is satisfied, no separate pH shock may occur due to the pH change of the abrasive particles. Additionally, when the above-described range value is satisfied, the abrasive particles in the composition for a semiconductor process do not aggregate, and are included in a stable state, so that when being applied to a polishing process, the abrasive particles not only can provide excellent polishing performance, but also can prevent defects from occurring in the polishing process.

As described above, the abrasive particles of the present disclosure are characterized in that the zeta potential change rate represented by Equation 3 below is from 8 mV/pH to 20 mV/pH:

$$\text{Zeta potential change rate}=|(Z6-Z1)/(p6-p1)| \quad \text{[Equation 3]}$$

where p6 denotes pH 6, p1 denotes pH 1,
Z6 denotes a zeta potential at the pH 6, and Z1 denotes a zeta potential at the pH 1.

The zeta potential change rate according to Equation 3 may be from about 8 mV/pH to about 20 mV/pH, from about 8 mV/pH to 18 mV/pH, or from about 8 mV/pH to about 16 mV/pH. Equation 3 relates to the zeta potential change rate as the state of the weakly acidic abrasive particles changes to the strongly acidic abrasive particles, and it may mean that when the above range is satisfied, both the weakly acidic abrasive particles and the strongly acidic abrasive particles have excellent dispersibility. When the degree of change of the zeta potential value for the abrasive particles in the weakly acidic state and the zeta potential value for the abrasive particles in the strongly acidic state is represented as in the above range, the dispersibility of the abrasive particles is excellent in the composition for a semiconductor process, so aggregation between the particles does not occur, and therefore, as described above, a stable state can be maintained between the abrasive particles, and they can exhibit a uniform size within a certain range.

As described above, the abrasive particles of the present disclosure are characterized in that the zeta potential change rate represented by Equation 4 below is from 9.5 mV/pH to 20 mV/pH:

$$\text{Zeta potential change rate}=|(Z6-Z2)/(p6-p2)| \quad \text{[Equation 4]}$$

where p6 denotes pH 6, p2 denotes pH 2,
Z6 denotes a zeta potential at the pH 6, and Z2 denotes a zeta potential at the pH 2.

The zeta potential change rate according to Equation 4 above may be from about 9.5 mV/pH to about 20 mV/pH, from about 9.5 mV/pH to 19 mV/pH, or from about 9.5 mV/pH to about 18 mV/pH. When making abrasive particles in a weakly acidic state into abrasive particles in a strongly acidic state in order to make the abrasive particles in a weakly acidic state into an abrasive composition, and if the zeta potential change is in the range of Equation 4, then the shock due to pH change does not occur, and a separate process for preventing particle aggregation is not required, thereby simplifying the manufacturing process and increasing production efficiency. Further, when the composition for a semiconductor process including the abrasive particles is used in a polishing process, the polishing rate for the target film is excellent, and faults such as defects can be prevented.

Additionally, as described above, the zeta potential change of the abrasive particles of the present disclosure due to pH change from pH 6 to pH 4 in the process may be from about 31 mV to about 75 mV, from about 35 mV to about 68 mV, or from about 35 mV to about 65 mV. As described above, the abrasive particles of the present disclosure are for preparing a composition for a semiconductor process by using the abrasive particles in a weakly acidic state with a pH of 6 and changing the pH to a weakly acidic state with a pH of 4, and the zeta potential is changed depending on the degree of change of the pH, and it can be changed within the above-described range. This means a zeta potential change that can prevent the occurrence of pH shock according to pH change of abrasive particles in a process for preparing a composition for a semiconductor process, and no shock occurs to the abrasive particles even when the zeta potential changes according to the pH change within the above range, so that when provided as a composition for a semiconductor process, excellent dispersibility can be exhibited, and thus when applied to a polishing process, not only excellent polishing performance can be provided, but also defects can be prevented during the polishing process.

Specifically, it can be applied to chemical mechanical polishing of semiconductor wafers to realize excellent effects in terms of polishing planarization and minimize the occurrence of faults such as defects. The composition for a semiconductor process is applied to a polishing process for a semiconductor wafer, and can exhibit significantly improved polishing performance for a tungsten film and a metal barrier film.

That is, the composition for a semiconductor process of the present disclosure can prevent the occurrence of faults, such as defects, while achieving a desired level of polishing performance, for a semiconductor wafer including a tungsten film and a metal barrier film.

Abrasive particles according to an embodiment of the present disclosure may include particles that have been surface-treated such that the zeta potential value of the abrasive particles in the composition for a semiconductor process exhibits a positive (+) value. Specifically, the abrasive particles are surface-treated to have a zeta potential value of positive (+) when the pH is 4, and at this time, the zeta potential may be from about 10 mV to about 50 mV, preferably from about 15 mV to about 45 mV, and more preferably from about 20 mV to about 40 mV.

The abrasive particles included in the composition for a semiconductor process of the present disclosure described above are characterized in that they are surface-treated so that the zeta potential value has a positive (+) value, and due to this characteristic, the occurrence of faults such as defects can be prevented.

As shown in FIG. 5, a composition for a semiconductor process including abrasive particles surface-treated to have a positive (+) zeta potential value has excellent adsorption efficiency with a semiconductor wafer and can improve polishing performance. Specifically, the surface of the semiconductor wafer has a negative (−) zeta potential value. The surface of the semiconductor wafer exhibits a negative zeta potential as described above, and thus, when abrasive particles having a positive zeta potential are used, adsorption efficiency between the semiconductor wafer and the abrasive particles can be improved by electrostatic attraction. According to the improvement in adsorption efficiency as described above, chemical bonding is easily formed, and mechanical wear easily occurs, thereby facilitating the removal of the target film.

Additionally, the abrasive particles surface-treated so that the zeta potential value has a positive value can easily bond with a semiconductor wafer exhibiting a negative zeta potential by electrostatic attraction, but such bonding can be easily separated by compression and rotation of the semiconductor wafer and the polishing pad.

Contrarily, as shown in FIG. 6, the composition for a semiconductor process including abrasive particles having a negative zeta potential value may cause electrostatic repulsion with a semiconductor wafer having a negative zeta potential value. Therefore, the abrasive particles represented in FIG. 6 may not be adsorbed to the semiconductor wafer, and due to this, mechanical wear may not easily occur or removal of the target film may not be easy.

More specifically, the abrasive particles may include inorganic particles, and the inorganic particles may include particles surface-treated with at least one kind of organic component.

In one embodiment, the at least one kind of organic component for surface treatment of the inorganic particles may include, for example, one selected from the group consisting of amino silane, alkoxy silane, ethoxy silane, epoxy silane, and combinations thereof. The organic component may be an amino silane, and, more specifically, the amino silane is selected from the group consisting of 3-aminopropyltriethoxysilane (APTES), 3-aminopropyltrimethoxysilane (APTMS), 3-glycidoxypropyltrimethoxysilane (GPTMS), 3-glycidoxypropylmethyldimethoxysilane (GPDMS), 3-aminopropylmethyldiethoxysilane (APDES), 3-mercaptopropyltrimethoxysilane (MrPTMS), 3-mercaptopropyltrimethyldimethoxysilane (MrPDMS), 3-methacryloxypropyltrimethoxysilane (MPTMS), 3-methacryloxypropylmethyldimethoxysilane (MPDMS), and mixtures thereof.

In one embodiment, the inorganic particles may include silica ($SiO_2$), and at least one kind of organic component applied to the surface treatment of the inorganic particles may include amino silane or epoxy silane. Abrasive particles dispersed in an acidic solution are characterized by having a positive zeta potential value. As a result, it is easy to be adsorbed to the surface of the semiconductor wafer, which has the negative zeta potential, and mechanical wear is easy, so that the polishing rate for the target film can be increased.

The abrasive particles of the present disclosure may include about 0.01 part by weight to about 1 part by weight of an organic component, and about 0.01 part by weight to about 1 part by weight of an organic acid, preferably about 0.05 part by weight to about 0.8 part by weight of an organic component, and about 0.05 part by weight to about 0.8 part by weight of an organic acid, more preferably about 0.1 part by weight to about 0.8 part by weight of an organic component, and about 0.05 part by weight to about 0.5 part by weight of an organic acid, based on 100 parts by weight of the abrasive particles, for surface treatment with an organic component. By the inclusion within the above ranges, the dispersibility can be improved when the pH of the abrasive particles is adjusted, and the abrasive particles can exhibit a positive zeta potential, so that after being prepared as the composition for a semiconductor process, during the application to a manufacturing process of a semiconductor device, polishing performance can be improved and faults such as defects can be prevented.

In another embodiment, the abrasive particles may include organic-inorganic composite particles, and the organic-inorganic composite particle may be, for example, a particle having a core-shell structure constituted with a core including a polymer resin, and a shell including an inorganic component disposed on the surface of the core.

The core of the organic-inorganic composite particle may include a polymer resin, such as a polymethylmethacrylate (PMMA) resin, or a polystyrene (PS) resin. The inorganic component of the shell may include, for example, silica, silica ($SiO_2$), ceria ($CeO_2$), alumina ($Al_2O_3$), titania ($TiO_2$), zirconia ($ZrO_2$), germania ($GeO_2$) and the like.

The particles included in the abrasive particles may have, for example, an average particle diameter (D50) of about 5 nm to about 150 nm, for example, an average particle diameter (D50) of about 5 nm to about 100 nm, for example, an average particle diameter (D50) of about 5 nm to about 80 nm, for example, an average particle diameter (D50) of about 10 nm to about 80 nm, for example, an average particle diameter (D50) of about 30 nm to about 50 nm, for example, an average particle diameter (D50) of about 30 nm to about 45 nm, or, for example, an average particle diameter (D50) of about 34 nm to about 44 nm. By applying the abrasive particles of this size, the composition for a semiconductor process may be more advantageous in satisfying the condition of Equation 1 above.

For example, the abrasive particles may have a 10% cumulative mass particle size distribution diameter (D10) in a particle distribution thereof of about 5 nm to about 50 nm, such as about 5 nm to about 35 nm, such as about 10 nm to about 35 nm, such as from about 20 nm to about 35 nm, or, such as from about 23 nm to about 33 nm.

For example, the abrasive particles may have a 90% cumulative mass particle size distribution diameter (D90) in a particle distribution thereof of about 40 nm to about 150 nm, such as about 40 nm to about 100 nm, such as about 45 nm to about 80 nm, such as from about 45 nm to about 65 nm, or, such as from about 50 nm to about 60 nm.

For example, the abrasive particles may have, in a particle distribution thereof, a 10% cumulative mass particle size distribution diameter (D10) of about 23 nm to about 33 nm, a 50% cumulative mass particle size distribution diameter (D50) of about 34 nm to about 44 nm, and a 90% cumulative mass particle size distribution diameter (D90) of about 50 nm to about 60 nm.

The abrasive particles may satisfy, in a particle distribution thereof, a condition of 1.10≤D90/D50≤1.80, for example, 1.50≤D90/D10≤2.70, or, for example, 1.00≤D50/D10≤2.00. By applying abrasive particles having such particle distribution, the composition for a semiconductor process can be more advantageous in satisfying the value of Equation 1 within a predetermined range, and can be more advantageous in producing the corresponding good polishing results.

The method of measuring the particle size distribution of the abrasive particles is not particularly limited, and can be derived using any general-purpose equipment used for particle size analysis of nano (nm) size level particle powder in the art.

The composition for a semiconductor process may include at least one kind of additive in addition to the abrasive particles described above. The at least one kind of additive may serve to adjust a surface state of a polishing target to be suitable for polishing mainly through a chemical reaction.

The at least one kind of additive may include, for example, an organic acid. The organic acid may serve as a complexing agent that traps metal ions such as tungsten ions. The complexing agent serves to chelate the metal oxide oxidized by the oxidizing agent. That is, re-absorption of the metal oxide oxidized by the chelation reaction with the metal oxide to the metal film layer, which is the layer to be polished, can be suppressed, thereby increasing the polishing rate for the metal film and reducing surface defects. The organic acid may include one selected from the group consisting of acetic acid, formic acid, benzoic acid, nicotinic acid, picolinic acid, alanine, phenylalanine valine, leucine, isoleucine, arginine, aspartic acid, citric acid, adipic acid, succinic acid, oxalic acid, glycine, glutamic acid, glutaric acid, phthalic acid, histidine, threonine, serine, cysteine, methionine, asparagine, tyrosine, diiodotyrosine, tryptophan, proline, oxyproline, ethylenediaminetetraacetic acid (EDTA), nitrotriacetic acid (NTA), iminodiacetic acid (IDA), and combinations thereof. In one embodiment, the organic acid may include glycine.

The at least one kind of additive may include, for example, polyol. The polyol can suppress adsorption of abrasive particles onto a polished surface or occurrence of defects such as scratches, and improve dispersibility in a composition for a semiconductor process. For example, the polyol may include one selected from the group consisting of polyvinyl alcohol, cellulose, sorbitol, ethylene glycol monomethyl ether, ethylene glycol monoethyl ether, ethylene glycol diethyl ether, ethylene glycol monobutyl ether, diethylene glycol monomethyl ether, diethylene glycol diethylether, diethylene glycol monobutylether, propylene glycol monomethylether, propylene glycol monomethylether acetate, glycerin monomethylether, glycerin dimethylether, grissendi ethylether, glycerin triethylether, and combinations thereof. In one embodiment, the polyol may include sorbitol.

The at least one kind of additive may be a fluorine-based surfactant. Due to the inclusion of the fluorine-based surfactant, before the composition for a semiconductor process is applied to a polishing process; and/or during application to the polishing process, excessive adsorption of the abrasive particles onto the polished surface can be effectively prevented. Additionally, due to the inclusion of fluorine, it is possible to obtain an advantage of improving long-term storage stability by preventing the propagation of bacteria and fungi in the composition for a semiconductor process.

The surfactant of the present disclosure may be specifically selected from the group consisting of BNO-BS-BOH from BNO Chem company, FS-30, FS-31, FS-34, ET-3015, ET-3150, ET-3050, Capstone FS-3100 from Chemours™ company, and mixtures thereof, but any material that serves to prevent excessive adsorption of carbon residues onto the surface of the semiconductor substrate in the polishing process is not particularly limited.

The surfactant of the present disclosure is a nonionic surfactant, and a surfactant containing a nonionic fluorine-based polymer compound may be used alone or in a mixture with other nonionic surfactant.

The nonionic surfactant may be selected from the group consisting of polyethylene glycol, polypropylene glycol, polyethylene-propylene copolymer, polyalkyl oxide, polyoxyethylene oxide (PEO), polyethylene oxide, and polypropylene oxide, and the fluorine-based surfactant may be selected from the group consisting of sodium sulfonate fluorosurfactant, phosphate ester fluorosurfactant, amine oxide fluorosurfactant, betaine fluorosurfactant, ammonium carboxylate fluorosurfactant, stearate ester fluorosurfactant, quaternary ammonium fluorosurfactant, ethylene oxide/propylene oxide fluorosurfactant, and polyoxyethylene fluorosurfactant.

The at least one kind of additive may further include a pH adjusting agent. For example, the pH adjusting agent may include one selected from the group consisting of hydrochloric acid (HCl), phosphoric acid ($H_3PO_4$), sulfuric acid ($H_2SO_4$), nitric acid ($HNO_3$), ammonium hydroxide ($NH_4OH$), potassium hydroxide (KOH), sodium hydroxide (NaOH), and combinations thereof. When the at least one kind of additive includes a pH adjusting agent, it may be included in an amount of about 0.01% to about 5% by weight based on the total weight of the composition for a semiconductor process.

The composition for a semiconductor process may include a solvent other than each of the components described above. The solvent may be, for example, water ($H_2O$), and specifically, ultrapure water may be applied.

The composition for a semiconductor process may include about 1% to 10% by weight of abrasive particles, about 0.5% to about 5% by weight of a polyol, about 0.01% to 1% by weight of an organic acid, and the remainder solvent, preferably about 1% to 8% by weight of abrasive particles, about 0.5% to about 4% by weight of a polyol, about 0.01% to 0.8% by weight of an organic acid, and the remainder solvent, more preferably about 1% to 5% by weight of abrasive particles, about 1% to about 4% by weight of a polyol, about 0.05% to 0.8% by weight of an organic acid, and the remainder solvent. When included within the above-described ranges, adsorption of abrasive particles onto the polished surface can be prevented, occurrence of defects can be prevented, and it may be more advantageous in implementing polishing rate, dispersion stability of the composition for a semiconductor process, and excellent planarization with respect to the polished surface.

The composition for a semiconductor process may have a solid content of about 5% to about 20% by weight. If the solid content is too small, there is a concern that the polishing rate for the silicon oxide film may not be sufficiently secured, and if it is too much, there is a concern that defects may occur due to aggregation of the abrasive particles or the like. That is, when the composition for a semiconductor process includes the above-described components and the solvent, and satisfies the solid content of the above range, and when applying the composition for a semiconductor process to a polishing process, it may be advantageous in injecting at a uniform flow rate, and it may be advantageous in ensuring uniform dispersibility and storage stability during distribution and storage process of the composition for a semiconductor process.

In another embodiment of the present disclosure, a method for preparing a composition for a semiconductor process may include adjusting pH to pH 2 to pH 4 by adding an acidic solution to abrasive particles having a pH of 6 and a zeta potential of −50 mV to −10 mV; and stirring the pH-adjusted abrasive particles and adding an organic component and an organic acid to the abrasive particles. The abrasive particles may have a zeta potential change rate of 6 mV/pH to 30 mV/pH represented by Equation 1 below:

$$\text{Zeta potential change rate(mV/pH)} = |(Z6-Z5)/(p6-p5)| \qquad \text{[Equation 1]}$$

where p6 denotes pH 6, p5 denotes pH 5,

Z6 denotes a zeta potential at the pH 6, and Z5 denotes a zeta potential at the pH 5.

In order to prepare the composition for a semiconductor process of the present disclosure, as described above, abrasive particles dispersed in a weakly acidic solution are used. The abrasive particles may have a zeta potential of about −50 mV to about −10 mV, about −40 mV to about −12 mV, about −35 mV to about −19 mV, or about −20.5 mV to about −30 mV at a weakly acidic with pH 6. The abrasive particles having a zeta potential value within the above range can be prepared as an abrasive composition in a stabilized state because the pH shock of the abrasive particles does not occur even when the pH is changed by mixing an acidic solution.

Specifically, the zeta potential change rate according to Equation 1 may be from 6 mV/pH to 30 mV/pH, from 14 mV/pH to 24 mV/pH, from 14 mV/pH to 19 mV/pH, or from 14.5 mV/pH to 18.5 mV/pH. As described above, the fact that the value of Equation 1 satisfies the scope of the present disclosure means that the stabilization state between the abrasive particles is maintained even when mixed with an acidic solution. When included within the above range, the pH change is small even when mixed with an acidic solution in the preparing process of the polishing composition. As a result, a pH shock does not occur in the abrasive particles, and a stable state can be maintained between the abrasive particles, so that the production efficiency of the polishing composition can be increased. Additionally, as the stable state is maintained between the abrasive particles, aggregation does not occur, and thus, when they are applied to a polishing process, the occurrence of defects can be prevented.

The abrasive particles are subjected to a stirring process, and at the same time, receives the addition of an organic acid to lower the pH to a strongly acidic pH of 2 to 4. Thereafter, while performing a stirring process, an organic component and an organic acid are added, so that the organic component can be bound to the surface of the abrasive particles.

In order to maintain a stable state between the abrasive particles, and to bind organic components to the surface of the particles, the stirring process may proceed at a speed of 1,500 rpm to 2,000 rpm, preferably 1,600 rpm to 1,900 rpm, more preferably 1,600 rpm to 1,800 rpm. As the stirring process proceeds at a rapid rate within the above range, the stabilization state between the particles can be maintained by the zeta potential of the abrasive particles, and organic components can be easily bonded to the surface of the particles. Additionally, as the stabilization state is maintained between the abrasive particles as described above, excellent dispersion characteristics can be exhibited.

The abrasive particles bound with the amine-based surface binder are separated through an ion exchange membrane, and the separated abrasive particles bound with the amine-based surface binder may be prepared as a composition for a semiconductor process.

The abrasive particles may be prepared as a composition for a semiconductor process by mixing with at least one additive. The at least one kind of additive may serve to adjust a surface state of a polishing target to be suitable for polishing mainly through a chemical reaction.

As described above, the one or more kind of additives may include organic acid, polyol, fluorine-based surfactant, and solvent. Additionally, the additive may further include pH adjusting agent, azole compound, phosphoric acid compound, and the like.

Regarding the description of the additive, the above-mentioned details may be equally applied to the integrated interpretation of the method for preparing a composition for a semiconductor process.

In another embodiment of the present disclosure, a method for preparing a semiconductor device may include preparing a surface plate on which a polishing pad having a polishing surface is mounted; preparing a carrier accommodating a polishing target; rotating the surface plate and the carrier in a state in which the polishing surface of the polishing pad and a polished surface of the polishing target are arranged to be in contact with each other; and supplying a composition for a semiconductor process onto the polishing surface, wherein the abrasive composition for a semiconductor process may include abrasive particles; and at least one kind of additive, and the abrasive particles may have a zeta potential change rate represented by Equation 1 below of 6 mV/pH to 30 mV/pH:

$$\text{Zeta potential change rate(mV/pH)} = |(Z6-Z5)/(p6-p5)| \qquad \text{[Equation 1]}$$

where p6 denotes pH 6, p5 denotes pH 5,

Z6 denotes a zeta potential at the pH 6, and Z5 denotes a zeta potential at the pH 5.

All the details associated with the composition for a semiconductor process and Equation 1 are the same as those described above with respect to the composition for a semiconductor process.

FIG. 4 schematically illustrates a configuration relating to a method for preparing a semiconductor device according to an embodiment of the present disclosure. Referring to FIG. 4, The method for preparing a semiconductor device may include preparing a surface plate 120 on which a polishing pad 110 having a polishing surface is mounted; and preparing a carrier 160 accommodating a polishing target 130.

In the method for preparing a semiconductor device, the polishing target 130 may be a semiconductor wafer having a structure as shown in FIG. 1. Specifically, as shown in FIG. 1, a $SiO_2$ oxide film is formed as an interlayer insulating film on a silicon substrate, and a contact hole is formed by etching the $SiO_2$ oxide film.

Subsequently, a metal barrier film such as Ti/TiN (adhesive layer/diffusion barrier layer) is formed on the front surface of the substrate including the contact hole, and a tungsten (W) film is deposited on the upper portion of the barrier film to completely fill the contact hole. Thereafter, the tungsten film and the metal barrier film on the $SiO_2$ oxide film are polished through a chemical mechanical polishing process using the composition for a semiconductor process, so that a tungsten plug is formed.

The composition for a semiconductor process of the present disclosure, which is for being applied to the polishing process to form the tungsten plug by polishing the tungsten film and the metal barrier film on the $SiO_2$ oxide film, can exhibits an excellent polishing performance for the tungsten film and the metal barrier film, and can minimize occurrence of faults such as defects.

Referring to FIGS. 1 and 2, the polishing target 130 may be the semiconductor wafer having the tungsten film 40 and the metal barrier film 30, and the semiconductor wafer may include the substrate 10; the $SiO_2$ oxide film 20; the metal barrier film 30 such as Ti/TiN (adhesive layer/diffusion barrier layer) on the $SiO_2$ oxide film; and the tungsten film 40 on the metal barrier film. The $SiO_2$ oxide film 20 is formed on the substrate 10 to a thickness of 1,000 to 2,000 Å, and the $SiO_2$ oxide film 20 is etched to form the contact hole.

Referring to FIG. 2, the method for preparing a semiconductor device may include rotating the surface plate 120 and the carrier 160 in a state in which the polishing surface of the polishing pad 110 and the polished surface of the polishing target 130 are arranged to be in contact with each other.

By mounting the polishing pad 110 on the surface plate 120 so that its polishing surface is the uppermost surface, and by the carrier 160 accommodating the polishing target 130 so that its polished surface is the lowermost surface, the polishing surface and the polished surface can be arranged to be in contact with each other. The contact between the polishing surface and the polished surface may be interpreted as including not only direct physical contact therebetween but also indirect contact through the abrasive particles in the composition for a semiconductor process.

As the surface plate 120 rotates, the polishing pad 110 also rotates with substantially the same trajectory and speed as those of the surface plate, and as the carrier 160 rotates, the polishing target 130 also rotates with substantially the same trajectory and speed as those of the carrier. The surface plate 120 and the carrier 160 may rotate in the same direction or in different directions.

In an embodiment of the present disclosure, the rotation speeds of the surface plate 120 and the carrier 160 may be each from about 10 rpm to about 500 rpm, for example, from about 30 rpm to about 200 rpm. When the surface plate 120 and the carrier 160 are each rotated at a rotational speed within the above range, the frictional behavior of the polishing surface and the polished surface by the centrifugal force is connected with the composition for a semiconductor process supplied on the polishing surface, so that polishing planarization can be secured with respect to the polished surface.

In one embodiment of the present disclosure, the rotational speed of the carrier 160 may be greater than the rotational speed of the surface plate 120. By rotating the carrier 160 at a higher speed than the surface plate 120, it may be advantageous in securing polishing stability and at the same time polishing the polished surface of the polishing target 130 without defects.

In one embodiment of the present disclosure, the method for preparing a semiconductor device may include rotating the surface plate 120 and the carrier 160 under a pressing condition with respect to the polishing surface of the carrier 160. Excellent polishing performance can be realized both when the carrier 160 is pressed against the polishing surface under a predetermined pressure condition so that the polished surface of the polishing target 130 is polished in direct contact with the polishing surface of the polishing pad 110; and when indirect contact polishing is performed with the composition for a semiconductor process 150 as a medium. For example, the load by which the carrier 160 is pressed against the polishing surface may be from about 0.01 psi to about 20 psi, for example, from about 0.1 psi to about 15 psi.

Referring to FIG. 2, the method for preparing a semiconductor device may further include supplying the composition 150 for semiconductor processing onto the polishing surface. More specifically, the composition for a semiconductor process 150 may be supplied onto the polishing surface through the supply nozzle 140.

In one embodiment of the present disclosure, the flow rate of the composition for a semiconductor process 150 injected through the supply nozzle 140 may be from about 10 mL/min to about 1,000 mL/min, for example, about 10 mL/min to about 800 mL/min, or, for example, about 50 mL/min to about 500 mL/min. When the composition for a semiconductor process 150 is supplied onto the polishing surface at a flow rate within the above range, it may be more advantageous in that the frictional behavior between the polishing surface and the polished surface through this medium improves the polishing performance for the polished surface. More specifically, the polishing performance can be excellent in the polishing result for the polished surface including the tungsten film and the metal barrier film by the structure of the semiconductor wafer, and occurrence of faults such as defects can be prevented.

The composition for a semiconductor process includes abrasive particles; and at least one kind of additive, and details about the abrasive particles and the at least one kind of additive are the same as described with regard to the composition for a semiconductor process. That is, all specific examples of the abrasive particles and the at least one kind of additive described above with respect to the composition for a semiconductor process and their technical advantages can be integrated and applied to the composition for a semiconductor process applied to the semiconductor manufacturing method, and in relation to other configurations of the semiconductor manufacturing method, for example, structures and driving of the surface plate and the carrier, an advantageous interaction may be made in terms of achieving a technical goal.

Referring to FIG. 2, in one embodiment, the method for preparing a semiconductor device may further include processing the polishing surface of the polishing pad 110 through a conditioner 170. The polishing surface of the polishing pad 110 is chemically affected by the continuous supply of the composition 150 for semiconductor processing, and at the same time, it is physically affected by physical contact with the polished surface of the polishing target 130. If the state of the polishing surface is deformed due to these chemical/physical effects, it may be difficult to maintain uniform polishing performance for the polished surface. Processing the polishing surface using the conditioner 170 may contribute to constantly maintaining the polishing surface in a state suitable for polishing.

For example, the conditioner 170 may serve to roughen the polishing surface while rotating at a predetermined speed. The rotation speed of the conditioner 170 may be, for example, from about 10 rpm to about 500 rpm, for example, about 50 rpm to about 500 rpm, for example, about 100 rpm to about 500 rpm, for example, about 200 rpm to about 500 rpm, or, for example, greater than about 200 rpm and less than about 400 rpm.

The conditioner 170 may rotate while being pressed with a predetermined pressure against the polishing surface of the polishing pad 110. For example, the pressure of the conditioner 170 pressing against the polishing surface may be from about 1 psi to about 20 psi, for example, from about 1 psi to about 15 psi, for example, from about 5 psi to about 15 psi, or, for example, from about 5 psi to about 10 psi.

By treating the surface under the above-described process conditions through the conditioner 170, the following effects can be obtained: the polishing surface can maintain an optimal surface state throughout the polishing process; and the polishing life can be prolonged under the application condition of the composition 150 for semiconductor processing.

Hereinafter, specific examples of the present disclosure are presented. However, the examples described below are merely for specifically illustrating or explaining the present disclosure, and the scope of the present disclosure is not construed as being limited by these examples, but is determined by the claims.

Preparation Example 1

Preparation of Abrasive Particles (Example 1)

Weakly acidic colloidal silica can be prepared using water glass as a precursor and KOH as a catalyst. Specifically, KOH was added to water glass to adjust the pH to a basic condition of pH 10. Under this basic condition, SiO was formed while forming seeds, which in turn grew into particles. Thereafter, a small amount of nitric acid was added, and unnecessary metal ions were removed using deionization as an ion exchange resin to prepare weakly acidic colloidal silica. The weakly acidic colloidal silica had a pH of 6, a zeta potential of −24 mV, and an average particle diameter (D50) of 41 nm.

While stirring the weakly acidic colloidal silica at 1,700 rpm, acetic acid and 3-aminopropyltriethoxysilane (APTES), an amino silane, were gradually added and dropped simultaneously at a rate of 100 ml/min to prepare a weakly acidic surface-modified colloidal silica having a pH of 3.8.

Examples 2 and 3

Weakly acidic surface-modified colloidal silica was prepared based on Preparation Example 1, but the weakly acidic surface-modified colloidal silica was prepared such that the addition amounts of the weakly acidic colloidal silica, amino silane and acetic acid were as shown in Table 1 below.

Comparative Example 1

Strongly basic colloidal silica having a pH of 9 and a zeta potential of −52 mV was prepared. The strongly basic colloidal silica was stirred at 1,700 rpm, and received the addition of nitric acid to prepare strongly acidic colloidal silica having a pH of 2.3. The acetic acid was added at a high rate of 50 ml/sec.

The strongly acidic colloidal silica was stirred at 1,700 rpm, and 3-aminopropyltriethoxysilane (APTES), an amino silane, and nitric acid were added little by little to prepare surface-modified colloidal silica.

Comparative Example 2

It was prepared in the same manner as in Comparative Example 1 except that the addition rate of 1 ml/sec was maintained when acetic acid was added to the strongly basic colloidal silica.

Comparative Example 3

Colloidal silica dispersed in a neutral solution having a zeta potential of −12 mV at pH 6 was prepared. The neutral colloidal silica was stirred at high speed, and in that state, nitric acid was added to the neutral colloidal silica to prepare strongly acidic colloidal silica having a pH of 2.3.

The strongly acidic colloidal silica was stirred at a high speed, and in a state of high-speed stirring, 3-aminopropyltriethoxysilane (APTES), an amino silane, and nitric acid were added little by little to the strongly acidic colloidal silica to prepare a surface-modified colloidal silica.

Comparative Example 4

Colloidal silica dispersed in a strongly basic solution and having a pH of 9 and a zeta potential of −52 mV was prepared. The neutral colloidal silica was stirred at 1,700 rpm, and nitric acid was added to prepare strongly acidic colloidal silica having a pH of 2.3.

The strongly acidic colloidal silica was stirred at 1,700 rpm, and 3-aminopropyltriethoxysilane (APTES), an amino silane, and nitric acid were added little by little to prepare surface-modified colloidal silica.

The zeta potential values according to the content and pH of the components for preparing the surface-modified colloidal silica of the above-described Examples and Comparative Examples are shown in Table 1 below. With the measured zeta potential value, a value according to Equation 1 below was also derived.

$$\text{Zeta potential change rate}(mV/pH) = |(Z6-Z5)/(p6-p5)| \quad \text{[Equation 1]}$$

where p6 denotes pH 6, p5 denotes pH 5,
Z6 denotes a zeta potential at the pH 6, and Z5 denotes a zeta potential at the pH 5.

Using the same method as in Equation 1, values for Equations 2 to 4 as follows were also derived.

$$\text{Zeta potential change rate} = |(Z6-Z4)/(p6-p4)| \quad \text{[Equation 2]}$$

where p6 denotes pH 6, p4 denotes pH 4,
Z6 denotes a zeta potential at the pH 6, and Z4 denotes a zeta potential at the pH 4.

$$\text{Zeta potential change rate} = |(Z6-Z1)/(p6-p1)| \quad \text{[Equation 3]}$$

where p6 denotes pH 6, p1 denotes pH 1,
Z6 denotes a zeta potential at the pH 6, and Z1 denotes a zeta potential at the pH 1.

$$\text{Zeta potential change rate} = |(Z6-Z2)/(p6-p2)| \quad \text{[Equation 4]}$$

where p6 denotes pH 6, p2 denotes pH 2,
Z6 denotes a zeta potential at the pH 6, and Z2 denotes a zeta potential at the pH 2.

The following zeta potential change rate was calculated in the same manner as in Equation 1 above, and specifically, the 1 to 2 change rate was calculated with (zeta potential at pH 1−zeta potential at pH 2)/(pH 2−pH 1), and other change rate values were calculated using the same method.

TABLE 1

|  |  | Example 1 | Example 2 | Example 3 | Comparative Example 1 | Comparative Example 2 | Comparative Example 3 | Comparative Example 4 |
|---|---|---|---|---|---|---|---|---|
| Colloidal silica | | 100 | 100 | 100 | 100 | 100 | 100 | 100 |
| Amino silane | | 0.4 | 0.4 | 0.2 | 0.4 | 0.6 | 0.1 | 0.6 |
| Acetic acid | | 0.2 | 0.1 | 0.1 | 0.03 | 0.3 | — | — |
| Nitric acid | | — | — | — | — | — | 0.01 | 0.02 |
| Zeta potential for each pH (mV) | pH 1 | 31 | 41 | 23 | 19 | 31 | 21 | 18 |
| | pH 2 | 28 | 42 | 19 | 14 | 29 | 18 | 17 |
| | pH 3 | 25 | 39 | 14 | 15 | 26 | 14 | 15 |
| | pH 4 | 24 | 36 | 12 | 13 | 24 | 12 | 11 |
| | pH 5 | −5 | −6 | −6 | −3 | −4 | −7 | −1 |
| | pH 6 | −22 | −24 | −21 | −5 | −8 | −12 | −20 |
| | pH 9 | — | — | — | −52 | −52 | — | −52 |
| Zeta potential change during process (|mV|) | | 46 | 60 | 33 | 66 | 81 | 30 | 69 |
| Zeta potential change rate (mV/pH) | 1 to 2 change rate | 3 | −1 | 4 | 5 | 2 | 3 | 1 |
| | 2 to 3 change rate | 3 | 3 | 5 | −1 | 3 | 4 | 2 |
| | 3 to 4 change rate | 1 | 3 | 2 | 2 | 2 | 2 | 4 |
| | 4 to 5 change rate | 29 | 42 | 18 | 26 | 28 | 19 | 12 |
| | Equation 1 | 17 | 18 | 15 | 2 | 4 | 5 | 19 |
| | Equation 2 | 23 | 30 | 16.5 | 9 | 16 | 12 | 15.5 |
| | Equation 3 | 10.6 | 13 | 8.8 | 4.8 | 7.8 | 6.6 | 7.6 |
| | Equation 4 | 12.5 | 16.5 | 10 | 4.75 | 9.25 | 7.5 | 9.25 |
| Polishing rate (Oxide, Å/min) | | 1824 | 1632 | 1845 | 1823 | 1722 | 1813 | 1532 |

(unit parts by weight, amino silane and acetic acid are parts by weight based on 100 parts by weight of colloidal silica)

Examples 1 to 3 are the zeta potential changes when pH changes from 6 to 4, and Comparative Examples 1 to 3 are zeta potential changes when pH changes from 6 to 2.

Preparation Example 2

Preparation of a Composition for a Semiconductor Process

Using the abrasive particles prepared in Examples 1 to 6 above, the abrasive particles was mixed with glycine (Glycine, Yunwoo Chemical company, A3-10), sorbitol (Sorbitol, Yunwoo Chemical company, GC-30), and a fluorine-based surfactant (Chemours, FS-30). Specifically, a composition for a semiconductor process was prepared by mixing 3% by weight of the abrasive particles, 0.1% by weight of glycine, 2% by weight of a sorbitol solution, 0.0025% by weight of a fluorine-based surfactant, and the remainder ultrapure water solvent.

Experiment Method (1) LPC Measurement 100 ml of each sample was prepared and aged for 2 hours to remove foam. Before measuring the sample, the entire line of the equipment was washed with ultrapure water. Under the following equipment and conditions, the diluted sample was measured more than 5 times and the average value was calculated.

Equipment name: accusizer Fx Nano (PSSA company)
flow rate: 15 ml/min
Number of channels: 32
Light Extinction collection time: 60 seconds
Initial concentration: 4000 pieces/ml
Minimum size: 0.56 μm
Maximum size: 20 μm (2) Defect Measurement Referring to FIG. 1, a wafer was prepared which includes the $SiO_2$ oxide film as an interlayer insulating film on a silicon substrate 10, the contact hole formed by etching the $SiO_2$ oxide film, the metal barrier film 30 such as Ti/TiN (adhesive layer/diffusion barrier layer) on the front surface of the substrate including the contact hole, and the tungsten (W) film formed on the upper portion to completely fill the contact hole. As shown in FIG. 2, the pattern wafer as the polishing target 130 was accommodated in the carrier 160 with the polished surface facing downward. After locating the carrier 160 with respect to the surface plate 120 on which the polishing pad 110 is mounted with the polishing surface facing upward so that the polished surface and the polishing surface come into contact, respective components were operated at a pressure of 3.0 psi of the carrier 160 against the polishing surface, a rotational speed of the carrier 160 of 93 rpm, and a rotational speed of the plate surface 120 of 87 rpm for 60 seconds, and polishing was performed while applying the composition for a semiconductor process of each of Examples and Comparative Examples above to the polishing surface under a condition of a flow rate of 300 ml/min. After the polishing was completed, a cleaning process was performed while injecting a cleaning solution at a brush rotational speed of 500 rpm and 2,000 cc/min injecting condition for 60 seconds. After the cleaning process was completed, the total number of defects was measured using AIT-XP+ equipment installed in SKC company while the pattern wafer was in a sealed state in a wafer foup. A polishing rate (Å/min) was calculated by measuring the thickness after polishing under the above-described polishing conditions.

TABLE 2

| | LPC | | | Number of defects | Polishing rate (Oxide, Å/min) |
|---|---|---|---|---|---|
| | 1 μm< | 3 μm< | 5 μm< | | |
| Example 1 | 1944 | 630 | 284 | 243 | 1,824 |
| Example 2 | 1824 | 423 | 143 | 181 | 1,632 |
| Example 3 | 2214 | 821 | 344 | 269 | 1,845 |
| Comparative Example 1 | 7421 | 2423 | 724 | 1785 | 1,823 |
| Comparative Example 2 | 4421 | 1872 | 435 | 2783 | 1,722 |
| Comparative Example 3 | 8241 | 3114 | 921 | 3482 | 1,813 |
| Comparative Example 4 | 3423 | 1142 | 587 | 5529 | 1,532 |

According to Table 2, the number of defects generated when the polishing process was performed using the polishing compositions of Examples 1 to 3 of the present disclosure was significantly different from that of each Comparative Example. Specifically, in the case of Example 1, the number of defects is 243; in the case of Example 2, it 181; and in the case of Example 3, it is 269. Contrarily, it was confirmed that in the case of Comparative Example 1, it was 1785; in the case of Comparative Example 2, it was 2783; in the case of Comparative Example 3, it was 3482; and in the case of Comparative Example 4, it was 5529.

The large difference in the number of defects as described above can be compared by the LPC analysis results. Example 1 has 284 particles larger than 5 μm and 630 particles larger than 3 μm; Example 2 has 143 particles larger than 5 μm and 423 particles larger than 3 μm; and Example 3 has 344 particles larger than 5 μm and 821 particles larger than 3 μm, whereas Comparative Example 1 has 724 particles larger than 5 μm and 2,423 particles larger than 3 μm; Comparative Example 2 has 435 particles larger than 5 μm and 1,872 particles larger than 3 μm; comparative Example 3 has 921 particles larger than 5 μm and 3,114 particles larger than 3 μm; and Comparative Example 4 have 587 particles larger than 5 μm and 1,142 particles larger than 3 μm. As such, the particle size difference was great.

Additionally, according to the result of measuring the polishing rate for the oxide film, Example 1 is 1,824 Å/min, Example 2 is 1,632 Å/min, Example 3 is 1,845 Å/min, and even in the case of Comparative Examples 1 to 4, measuring results are 1,823 Å/min, 1,722 Å/min, 1,813 Å/min, and 1,532 Å/min, respectively. It is confirmed that there is no significant difference.

This may mean that compared to the abrasive particles included in the conventional composition for a semiconductor process, the composition for a semiconductor process including the abrasive particles of the present disclosure can exhibit equivalent or higher polishing performance, and can lower the occurrence of faults such as defects.

While the preferred embodiments of the present disclosure have been described in detail until now, the scope of the patent right of the present disclosure is not limited thereto, but various modifications and improvements which could be made by those skilled in the art using the basic concept of the present disclosure defined in the following claims would also fall within the scope of the patent right of the present disclosure.

REFERENCE SIGN LIST

10: Substrate
20: $SiO_2$ oxide film
30: Metal barrier film
40: Tungsten film
D1: Diameter of via
D2: Diameter of the conductor filling electrode
T1: Thickness of the second silicon nitride film
21: First silicon nitride film
22: Second silicon nitride film
110: Polishing pad
120: Surface plate
130: Polishing target
140: Supply nozzle
150: Composition for a semiconductor process
160: Carrier
170: Conditioner
200: Zeta potential change of colloidal silica dispersed in weakly acidic solution
210: colloidal silica dispersed in weakly acidic solution
220: Colloidal silica dispersed in strongly acidic solution
230: Surface-modified colloidal silica dispersed in strongly acidic solution
300: Zeta potential change of colloidal silica dispersed in strongly basic solution
310: Colloidal silica dispersed in strongly basic solution
320: Colloidal silica dispersed in strongly acidic solution
330: Surface-modified colloidal silica dispersed in strongly acidic solution
400: Abrasive particles surface-treated such that the zeta potential value is positive (+)
410: Abrasive particles surface-treated such that the zeta potential value is negative (−)

The invention claimed is:

1. A composition for a semiconductor process comprising: abrasive particles,
wherein the abrasive particles have a zeta potential of −50 mV to −10 mV at pH 6, a zeta potential change rate represented by Equation 1 below of 6 mV/pH to 30 mV/pH, a zeta potential change rate represented by Equation 3 below of 8 mV/pH to 20 mV/pH, and a zeta potential change rate represented by Equation 4 below of 9.5 mV/pH to 20 mV/pH:

$$\text{Zeta potential change rate (mV/pH)} = |(Z6-Z5)/(p6-p5)| \quad \text{[Equation 1]}$$

$$\text{Zeta potential change rate} = |(Z6-Z1)/(p6-p1)| \quad \text{[Equation 3]}$$

$$\text{Zeta potential change rate} = |(Z6-Z2)/(p6-p2)| \quad \text{[Equation 4]}$$

where p6 denotes pH 6, p5 denotes pH 5, p2 denotes pH 2, p1 denotes pH 1,
Z6 denotes a zeta potential at the pH 6, and Z5 denotes a zeta potential at the pH 5, Z2 denotes a zeta potential at the pH 2, and Z1 denotes a zeta potential at the pH 1.

2. The composition for a semiconductor process of claim 1, wherein the abrasive particles are surface-treated to have a positive (+) zeta potential value when a pH is from pH2 to pH4.

3. The composition for a semiconductor process of claim 2, wherein the abrasive particles have a zeta potential of 10 mV to 50 mV.

4. The composition for a semiconductor process of claim 1, wherein the abrasive particles include one selected from the group consisting of silica ($SiO_2$), ceria ($CeO_2$), alumina ($Al_2O_3$), zirconia ($ZrO_2$), and combinations thereof.

5. The composition for a semiconductor process of claim 1, wherein the composition for a semiconductor process further comprises at least one kind of additive selected from the group consisting of organic acid, polyol, surfactant, and combinations thereof.

6. The composition for a semiconductor process of claim 5, wherein the surfactant is fluorine-based surfactant.

7. The composition for a semiconductor process of claim 5, wherein the organic acid is selected from the group consisting of nitric acid, acetic acid, formic acid, benzoic acid, nicotinic acid, picolinic acid, alanine, phenylalanine valine, leucine, isoleucine, arginine, aspartic acid, citric acid, adipic acid, succinic acid, oxalic acid, glycine, glutamic acid, glutaric acid, phthalic acid, histidine, threonine, serine, cysteine, methionine, asparagine, tyrosine, diiodotyrosine, tryptophan, proline, oxyproline, ethylenediaminetetraacetic acid (EDTA), nitrotriacetic acid (NTA), iminodiacetic acid (IDA), and combinations thereof.

8. The composition for a semiconductor process of claim 5, wherein the polyol is selected from the group consisting of polyvinyl alcohol, cellulose, sorbitol, ethylene glycol monomethyl ether, ethylene glycol monoethylether, ethylene glycol diethylether, ethylene glycol monobutylether, diethylene glycol monomethylether, diethylene glycol diethylether, diethylene glycol monobutylether, propylene glycol monomethylether, propylene glycol monomethylether acetate, glycerin monomethylether, glycerin dimethylether, grissendi ethylether, glycerin triethylether, and combinations thereof.

9. The composition for a semiconductor process of claim 1, wherein the abrasive particles have a zeta potential change rate represented by Equation 2 below of 14 mV/pH to 40 mV/pH:

$$\text{Zeta potential change rate} = |(Z6-Z4)/(p6-p4)| \quad \text{[Equation 2]}$$

where p6 denotes pH 6, p4 denotes pH 4,
Z6 denotes a zeta potential at the pH 6, and Z4 denotes a zeta potential at the pH 4.

10. The composition for a semiconductor process of claim 1, where the abrasive particles have an average particle diameter (D50) of 5 nm to 150 nm.

11. The composition for a semiconductor process of claim 1, wherein the abrasive particles have a 10% cumulative mass particle size distribution diameter (D10) of 5 nm to 50 nm.

12. The composition for a semiconductor process of claim 1, wherein the abrasive particles have a 90% cumulative mass particle size distribution diameter (D90) of 40 nm to 150 nm.

13. The composition for a semiconductor process of claim 1, wherein the composition for a semiconductor process has 100 to 700 particles greater than 5 μm as a result of LPC measurement, and wherein the LPC measurement conditions are that the composition for a semiconductor process is diluted such that an initial concentration is 4,000 pieces/ml, the minimum size is 0.56 μm, a maximum size is 20 μm, and that an injection rate of the diluted composition for a semiconductor process is 15 ml/min.

* * * * *